(12) United States Patent
Tada et al.

(10) Patent No.: US 7,247,548 B2
(45) Date of Patent: Jul. 24, 2007

(54) DOPING METHOD AND SEMICONDUCTOR DEVICE USING THE SAME

(75) Inventors: Tetsuya Tada, Tsukuba (JP); Toshihiko Kanayama, Tsukuba (JP); Hidefumi Hiura, Tokyo (JP)

(73) Assignee: National Institute of Advanced Industrial Science and Technology (JP)

( * ) Notice: Subject to any disclaimer, the term of this patent is extended or adjusted under 35 U.S.C. 154(b) by 309 days.

(21) Appl. No.: 11/005,285

(22) Filed: Dec. 6, 2004

(65) Prior Publication Data

US 2005/0130395 A1 Jun. 16, 2005

(30) Foreign Application Priority Data

Dec. 12, 2003 (JP) .............................. 2003-414550

(51) Int. Cl.
*H01L 21/22* (2006.01)
(52) U.S. Cl. ................. 438/542; 438/558; 438/562
(58) Field of Classification Search ................ 438/542, 438/558, 562; 257/40, 288
See application file for complete search history.

(56) References Cited

U.S. PATENT DOCUMENTS

| 6,960,782 B2* | 11/2005 | Allenspach et al. .......... 257/40 |
| 2003/0047729 A1* | 3/2003 | Hirai et al. .................... 257/40 |
| 2006/0024502 A1* | 2/2006 | McFarland et al. ......... 428/408 |

FOREIGN PATENT DOCUMENTS

JP 8-167658 6/1996

OTHER PUBLICATIONS

A. Ono et al., 2000, *A 70 nm Gate Length CMOS Technology with 1.0 V Operation*, 2000 Symposium on VLSI Technology Digest of Technical Papers.
Mizuno et al., 2001, *Plasma Doping*, vol. 70, No. 12, p. 1458-1462.
Muto et al., 2001, *Electronic Materials and Parts*, Guide Book of VLSI Production and Testing Equipment, p. 95-99, 2001.
K. Shibahara et al., 2001, *Laser Doping*, Sold State Devices and Materials, p. 236.

* cited by examiner

*Primary Examiner*—Tuan H. Nguyen
(74) *Attorney, Agent, or Firm*—McGlew and Tuttle P.C.

(57) ABSTRACT

The present invention achieves a shallow junction of a source and a drain, and provides a doping method which makes device properties reproducible and a semiconductor device fabricated using the method. In the present invention, doping for the semiconductor is conducted by attaching a molecular species with a higher electron affinity or lower ionization energy out of fullerene derivatives or metallocenes to the semiconductor surface to induce charge transfer from the molecule to the semiconductor.

18 Claims, 5 Drawing Sheets

EXAMPLE OF SAMPLE STRUCTURE

SCHEMATIC VIEW OF CHARGE TRANSFER
FROM CARRIER DONATING MOLECULES TO SEMICONDUCTOR SURFACE

EXAMPLE OF SAMPLE STRUCTURE

CHANGES IN CURRENT-VOLTAGE CHARACTERISTICS
DUE TO DEPOSITION OF $C_{60}F_{36}$

3-TERMINAL STRUCTURE FABRICATED ON SOI

CURRENT-VOLTAGE CHARACTERISTICS OF SAMPLE OF FIG. 4
BEFORE AND AFTER DEPOSITION OF $C_{60}F_{36}$

SHEET RESISTANCE AND AMOUNT OF INDUCED ELECTRONS
UPON DEPOSITION OF DECAMETHYL NICKELOCENE

DECAMETHYLNICKELOCENE

EXAMPLE OF PROCESS FOR PRODUCING MOSFET

EXAMPLE OF PROCESS FOR FABRICATING MEMORY DEVICE (a)  ← THERMAL OXIDE FILM (b)  ← SOURCE/DRAIN (c)  ← FULLERENE DERIVATIVE DEPOSITE (d)  ← PROTECTIVE FILM OF SILICON NITRIDE (e)  ← FORMATION OF GATE (f)  ← Al ELECTRODE

DOPING METHOD AND SEMICONDUCTOR DEVICE USING THE SAME

BACKGROUND OF THE INVENTION

1. Field of the Invention

The present invention relates to a doping method in a junction formation process, in particular, a shallow junction formation process, of a semiconductor device, and a semiconductor device using the same.

2. Description of the Related Art

For metal oxide semiconductor field effect transistors (MOSFET), high performance has been achieved by microfabrication in view of processing size. However, due to the shortened channel length, phenomena called short channel effect and hot carrier phenomena have arisen and prevented improvement of the performance of the device.

To avoid such negative impact, it is necessary to make the source/drain junction shallow. In addition, to increase the current drivability of transistors, the resistance (layer resistance) of the doping layer of the source and the drain needs to be as low as possible. International Technology Roadmap for Semiconductors (ITRS 2002 Update) requires realization of a source/drain junction depth of 10 nm and a sheet resistance of 360 Ω by the year 2007.

Conventionally, as a technique for forming a shallow source/drain junction, a combination of low speed ion implantation and rapid thermal annealing process (A. Ono et al.: 2000 Symposium on VLSI Technology Digest of Technical Papers, p. 14), plasma doping (Bunji Mizuno, Oyo Buturi, Vol.70, No.12, p. 1458–1462, 2001), elevated source/drain due to selective epitaxial growth (Denshi Zairyo (Electronic Materials and Parts), November sppl. and Vol./2002, Guide Book of VLSI Production and Testing Equipment, p. 95–99, 2001), solid phase diffusion (Japanese Patent Application Laid-Open No. 8-167658) and laser doping (K. Shibahara et al.: 2001 Solid State Devices and Materials, p. 236).

SUMMARY OF THE INVENTION

The junction depth obtained by the conventional techniques as described above is 20 nm at the deepest, but to correspond with further microfabrication of devices, a technique for doping at a junction depth of not more than 10 nm is required. Since the above-mentioned methods include stochastic processes such as ion implantation and heat treatment, there have been great difficulties in achieving a shallow junction free of inequality.

The present invention can achieve a shallow source/drain junction, and an object of the present invention is to provide a doping method which makes device properties reproducible and a semiconductor device using the same.

In order to achieve the above-mentioned object, doping for semiconductor is conducted by attaching a molecular species with a higher electron affinity or lower ionization energy out of fullerene derivatives or metallocenes to the semiconductor surface to induce charge transfer from the molecules to the semiconductor.

According to the present invention, a shallow source/drain junction can be achieved and a doping method which makes device properties reproducible and a semiconductor device using the same can be provided.

The disclosure of Japanese Patent Application No. 2003-414550 filed Dec. 12, 2003 including specification, drawings and claims is incorporated herein by reference in its entirety.

DETAILED DESCRIPTION OF THE PREFERRED EMBODIMENTS

The present invention relates to formation of an extremely thin, high concentration carrier conducting layer under the surface of a semiconductor by charge transfer from carrier supplying molecules to the semiconductor surface by attaching, to the surface of the semiconductor, fullerene derivative molecules or metallocene molecules which serve as a carrier supplier.

Figure 1:
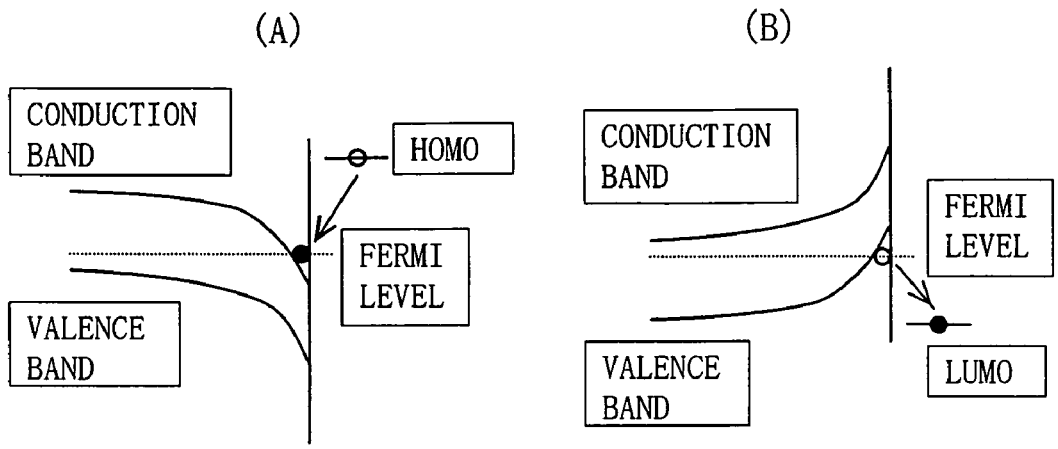
FIG. 1 is a schematic view illustrating charge transfer from carrier supplying molecules to the semiconductor surface.

In the formation of high concentration carrier conducting layer, the type of carrier to be introduced is determined according to the physical relation between the energy level of the molecules which are carrier suppliers attached to the semiconductor surface and the energy level on the semiconductor surface. As shown in FIG. 1(A), in the case of molecules having sufficiently low ionization energy, the energy level at the highest occupied molecular orbital (HOMO) of the molecules attached to the semiconductor surface is higher than that at the lower end of the conduction band of the semiconductor surface, and so the electrons are transferred to the semiconductor side from the molecules, inducing negative charge on the semiconductor surface, whereby the molecules are charged positive. Accordingly, an extremely thin conducting layer is formed in the vicinity of the semiconductor surface with electrons as carriers.

On the other hand, in the case of molecules having a sufficiently high electron affinity, the energy level at the lowest unoccupied molecular orbital (LUMO) of the molecules or clusters attached to the semiconductor surface is lower than that at the upper end of the valence band of the semiconductor surface, and so electrons are transferred to the molecules from the semiconductor side, inducing holes in the vicinity of the semiconductor surface, as shown in FIG. 1(B). Accordingly, an extremely thin conducting layer is formed in the vicinity of the semiconductor surface with holes as carriers.

Figure 7:
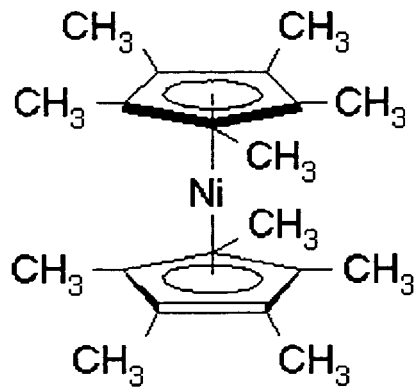
FIG. 7 is a view illustrating decamethylnickelocene.

In the present invention, the inventors used fullerene derivatives and metallocenes as the molecules to be attached. The reason therefor is that the electron affinity and the ionization energy can be different according to the kind of molecules to be added to fullerene in the case of the fullerene derivatives, and the kind of metal to be sandwiched or the kind of the side chain of the aromatic molecules above and below in the case of metallocene. Metallocene is a molecule shaped like a sandwich containing a metal atom between aromatic rings as shown in FIG. 7. Nickelocene is a molecule in which the sandwiched metal atom is nickel and decamethylnickelocene is a molecule in which the aromatic rings are 5-membered to which 10 methyl groups are bonded.

For example, a derivative in which fluorine is added to $C_{60}$ can be used for the doping of holes as the electron affinity becomes high. In particular, $C_{60}F_{36}$ and $C_{60}F_{48}$ are preferable because they have a high electron affinity of about 4 eV (for example, the electron affinity of $F_2$ which is considered to have an extremely high electron affinity is 3.0 eV). On the other hand, as nickelocene has low ionization energy, it can be used for the doping of electrons. In particular, decamethylnickelocene is preferable because it has low ionization energy of about 4.4 eV (for example, the ionization energy of Na which is considered to have low ionization energy is 5.1 eV).

In the junction formed according to a conventional doping method, carrier suppliers are present in the carrier conducting layer, and therefore the mobility is decreased due to scattering and the resistance is increased. On the contrary, since the present invention achieves doping only by attaching molecules to the semiconductor surface, the carriers in the conducting layer are less likely to be scattered by the carrier supplier. In addition, when molecules are attached densely to the semiconductor surface, the area density is fixed based on the size of the molecule, whereby a doping profile with low statistical fluctuation can be achieved. Because it is only necessary to attach molecules to the semiconductor surface, the characteristic is that occurrence of defect upon the processes such as ion implantation is extremely low. Examples of the attaching method include a vacuum deposition method, deposition by ion beam and spin coating.

The molecules which serve as carrier suppliers need not to be attached to the semiconductor surface directly. The above principle is effective even when the molecules are attached interposing a suitable thin dielectric film. For example, in the case of a silicon substrate, charge transfer can be induced by forming a thin thermal oxide film and adsorbing molecules thereto. At this stage, because the oxide film formed on the surface has an effect of reducing the trap level of the surface, the efficiency of doping improves. In addition, the surface trap level can be reduced by depositing an insulating material after attaching carrier supplier molecules. This case also has an advantage that the carrier supplying molecules are protected by the surrounding insulating material.

When the carrier supplier molecules and the semiconductor substrate are isolated by a dielectric, the carrier transfer is caused by tunneling through the dielectric. The probability of the carrier transfer can be increased by bringing the electron to the excitation state by irradiating the semiconductor substrate and the molecules with light. In other words, photo irradiation facilitates the carrier transfer from the molecules to the semiconductor substrate and even after the light is turned off, the condition is maintained because the molecules and the semiconductor are separated by a dielectric. Thus, the device can be used as a memory.

In addition, when carrier supplier molecules are embedded in the dielectric and a gate electrode is formed thereon, the charging state of the molecules can be controlled by applying electric voltage to the semiconductor substrate, and so the device can be used as a memory.

Examples according to the present invention are described in the following.

EXAMPLE 1

Figure 2:
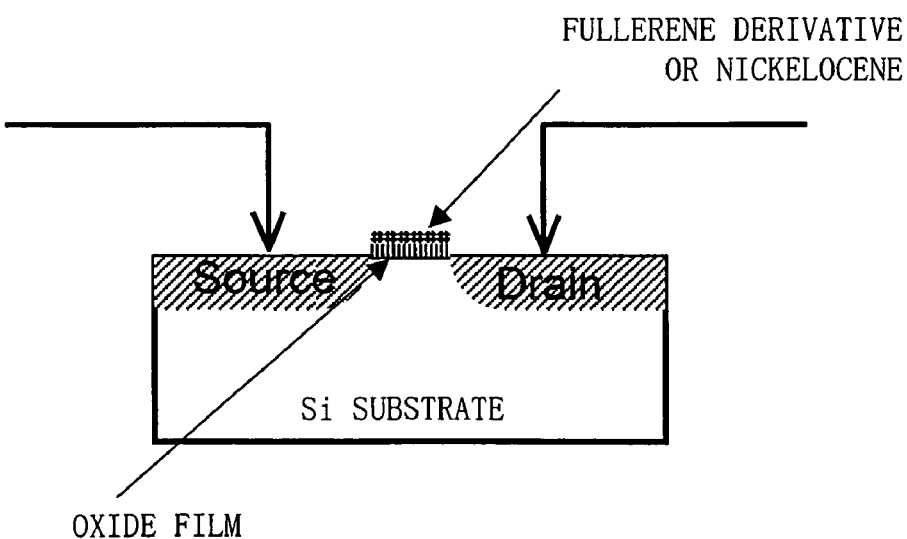
FIG. 2 is a view illustrating a structure of a sample.

Hole doping was investigated by using $C_{60}F_{36}$ having an electron affinity of about 4 eV. The structure of the used sample is one in which a $p^+$ source/drain region is formed on a n-type Si substrate and an oxide film of about 2 nm is formed on the part between the source and the drain (channel part) of the Si substrate surface as shown in FIG. 2. The current-voltage characteristics before and after depositing about 2 nm of $C_{60}F_{36}$ on the oxide film surface were measured. The measurement was conducted in vacuum.

Figure 3:
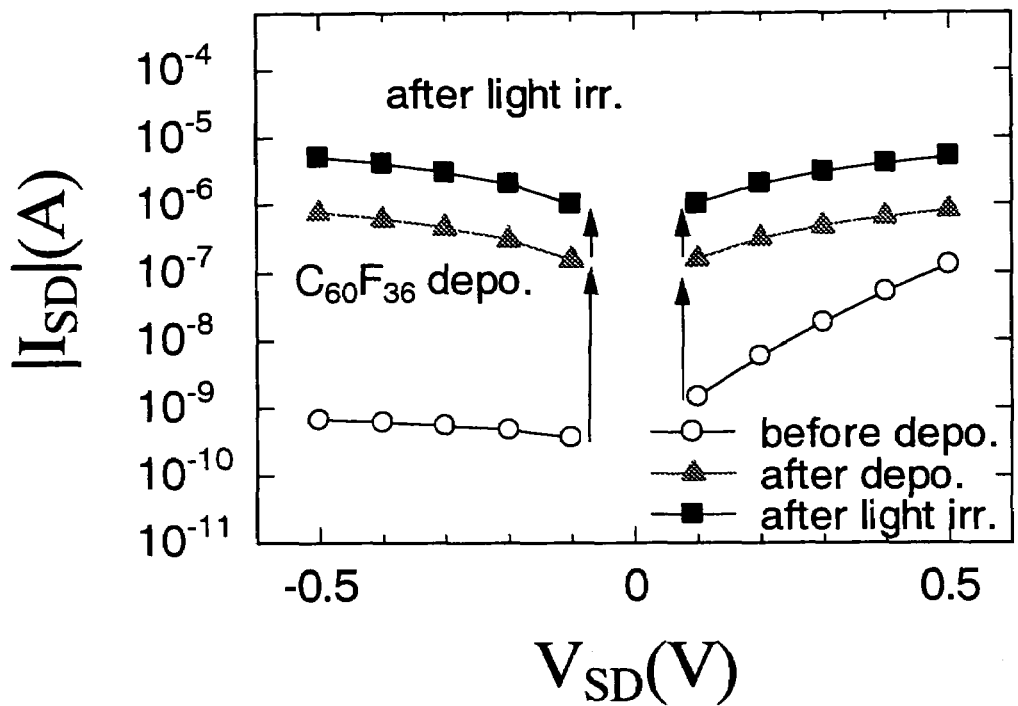
FIG. 3 is a graph showing changes in the current-voltage characteristics due to the deposition of $C_{60}F_{36}$.

As the graph of FIG. 3 shows, the resistance exhibited a triple-digit decrease due to the deposition of $C_{60}F_{36}$. When irradiated with light from a mercury lamp, charge transfer from $C_{60}F_{36}$ to the substrate was promoted and the resistance exhibited another single-digit decrease after turning off of the light. The final sheet resistance was 10 k$\Omega$. The above results show that an inversion layer was formed on the n-type channel region by $C_{60}F_{36}$ to form a conducting layer with holes.

For comparison, when $C_{60}$ was deposited on the channel region of a sample in which $p^+$ source/drain was formed on a n-type Si substrate and an oxide film of about 2 nm was formed on the part between the source and the drain (channel part) of the Si substrate surface as described above, the resistance exhibited a single-digit increase. In addition, when $C_{60}$ was deposited on a sample in which $n^+$ source/drain is formed on a p-type Si substrate in the same manner, the resistance also increased. This is because the electron affinity of $C_{60}$ of 2.65 eV is not sufficiently high and therefore level arises in the energy gap and carriers are trapped both in p-type and n-type.

From the foregoing, it has been proved that addition of fluorine to $C_{60}$ is effective for inducing holes in Si.

In addition, it has been found that since the resistance is decreased by light irradiation and the state is maintained after turning off of the light, the above structure can be used as a memory.

Figure 4:
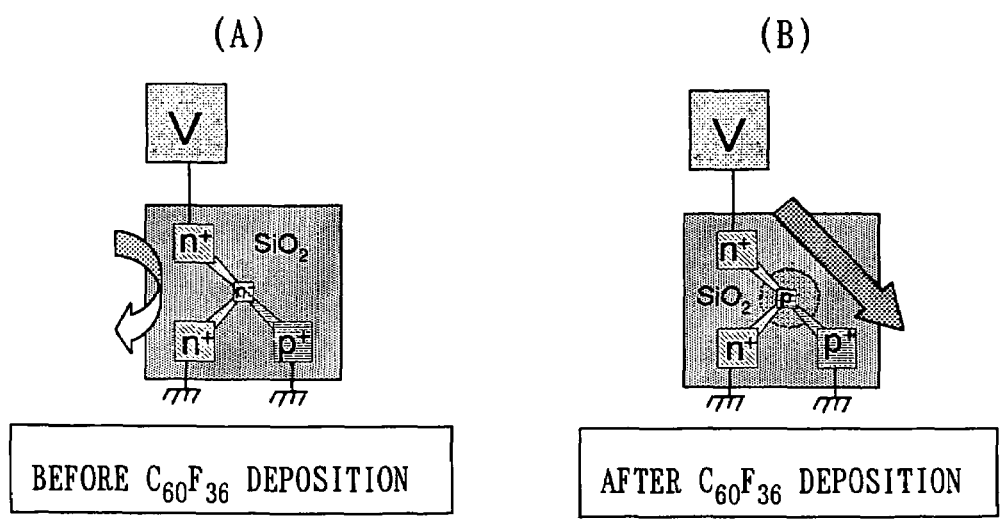
FIG. 4 is a view illustrating a 3-terminal structure made of Si fabricated on SOI.

EXAMPLE 2 p/n junction was formed using $C_{60}F_{36}$. FIG. 4 illustrates a structure of a sample of 3 terminals fabricated on SOI (Silicon on Insulator).

Figure 5:
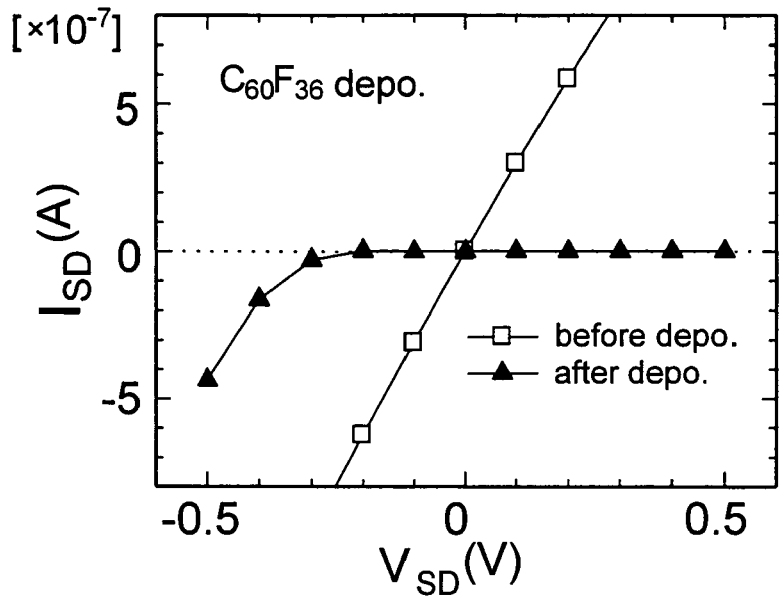
FIG. 5 is a graph showing current-voltage characteristics of the sample of FIG. 4 before and after the deposition of $C_{60}F_{36}$.

(A) indicates the condition before the deposition of $C_{60}F_{36}$, while (B) indicates the condition after the deposition of $C_{60}F_{36}$. Since the central part is converted to p-type from n-type after the deposition of $C_{60}F_{36}$, the channel in which current flows undergoes changes. The arrows show the channel of current flow. The n-type SOI substrate has a region for deposition of n at the center, from which three terminals of two $n^+$ terminals and one $p^+$ terminal are extended. On the surface of the deposition region, one of the $n^+$ terminals is connected to the power source and the other terminals are led to the ground. The I–V characteristics before the deposition of $C_{60}F_{36}$ are ohmic because of the flow from the $n^+$ terminal to the $n^+$ terminal as shown in FIG. 5. When $C_{60}F_{36}$ is deposited only on the center part in a thickness of about 2 nm, the deposited portion is converted to p-type and current begins to flow from the $n^+$ terminal to the $p^+$ terminal, assuming diode properties as shown in FIG. 5. From the foregoing, it has been proved that a junction was formed by the deposition of $C_{60}F_{36}$.

EXAMPLE 3

Figure 6:
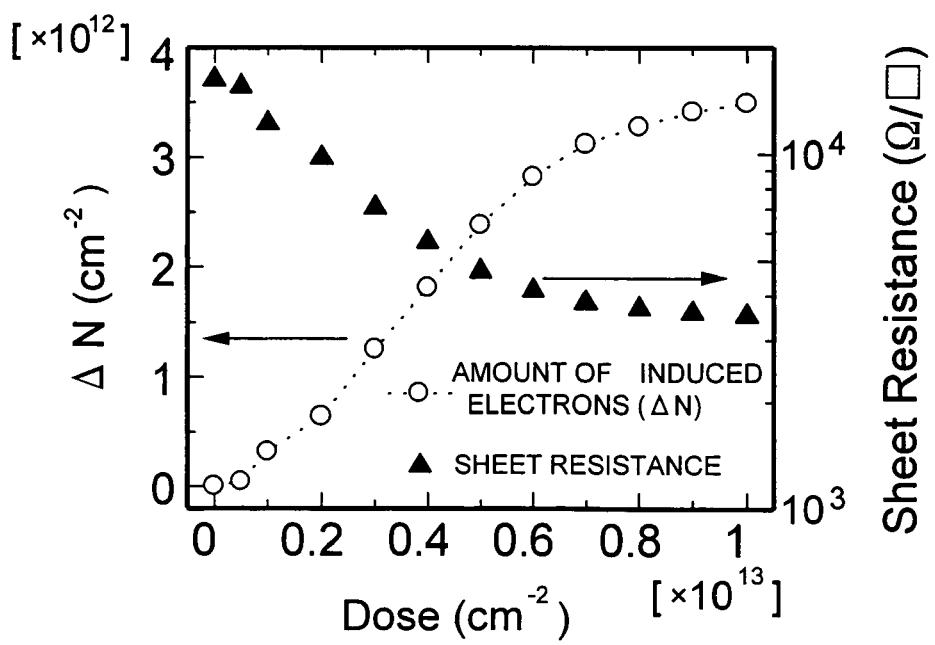
FIG. 6 is a graph showing the sheet resistance and the amount of induced electrons upon deposition of decamethylnickelocene.

When decamethylnickelocene was deposited on an n-type Si substrate having an oxide film of 2 nm on the surface, the resistance decreased as shown in FIG. 6. The sheet resistance decreased to 3.5 kΩ/sq from the initial resistance of 16 kΩ/sq at a deposition of $1\times10^{13}$ cm$^{-2}$. This suggests that about $4\times10^{12}$ cm$^{-2}$ of electrons were induced to the Si substrate by depositing decamethylnickelocene.

EXAMPLE 4

Figure 8:
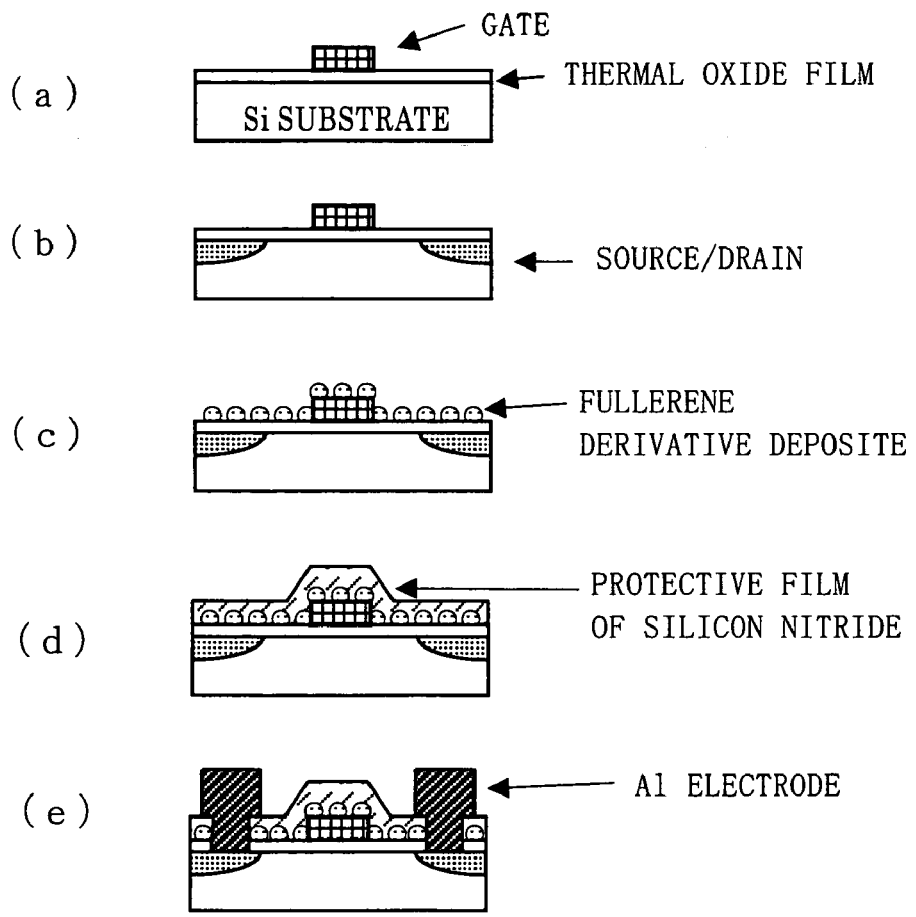
FIG. 8 is a view illustrating a process for producing a MOSFET.

FIG. 8 is a view illustrating a process for producing a MOSFET. An MOS transistor was prepared according to the process shown in the figure. In FIG. 8(a), a 2-nm thick oxide film was formed on the surface of a Si substrate by thermal oxidation at 850° C. under dry oxygen as a gate dielectric. Polycrystalline Si was deposited thereon and the deposit was processed into a gate having a length of 1 μm by photolithography. At this stage, $1\times10^{15}$/cm$^2$ of boron having 60 keV was implanted by ion implantation, and annealing for activation was conducted in a tube furnace under inert gas atmosphere at 900° C. for 10 min to form a source/drain pair (FIG. 8(b)). The distance between the gate and the source (drain) is 1 μm. Here, 1 nm of $C_{60}F_{36}$ was deposited on the surface of the device by vacuum deposition (FIG. 8(c)). As $C_{60}F_{36}$ induces holes in the silicon substrate, a source/drain extension region is formed between the gate and the source/drain. Then a silicon nitride film was deposited as a protective film (FIG. 8(d)). A window was opened by removing part of the silicon nitride film above the source/drain by dry etching and an aluminum electrode was deposited to complete a transistor (FIG. 8(e)). The prepared transistor exhibited excellent properties.

EXAMPLE 5

Figure 9:
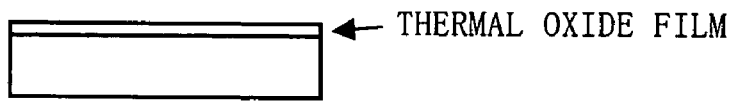
FIG. 9 is a view illustrating a process for fabricating a memory device.
Figure 9:
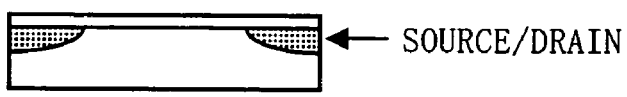
Figure 9:
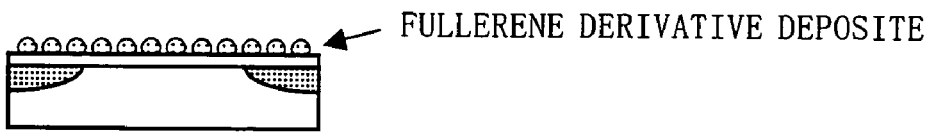
Figure 9:
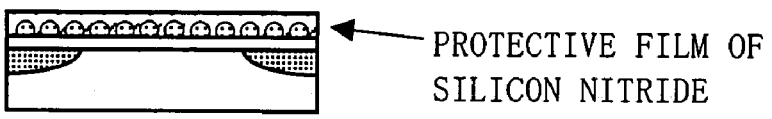
Figure 9:
Figure 9:
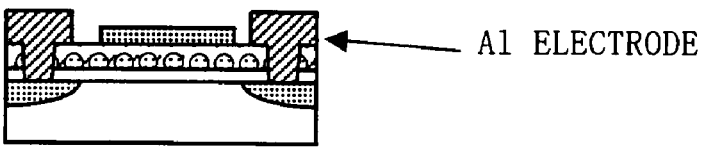

FIG. 9 is a view illustrating a process for fabricating a memory device. A memory device was fabricated according to the process shown in the figure. In FIG. 9(a), a 2 nm thick oxide film was formed on the surface of a Si substrate by thermal oxidation at 850° C. under dry oxygen as a gate dielectric. At this stage, $1\times10^{15}$/cm$^2$ of boron having 60 keV was implanted by an ion implantation method and annealing for activation was conducted in a tube furnace under inert gas atmosphere at 900° C. for 10 min to form source/drain (FIG. 9(b)). The distance of the source/drain is 10 μm. Here, 1 nm of $C_{60}F_{36}$ was deposited on the surface of the device by vacuum deposition (FIG. 9(c)). Then a silicon nitride film was deposited as a protective film (FIG. 9(d)) to form a gate electrode made of polysilicon between the source and the drain (FIG. 9(e)). A window was opened by removing part of the silicon nitride film above the source/drain by dry etching and an aluminum electrode was deposited to complete a memory device (FIG. 9(f)).

When negative voltage was applied to the gate electrode, the resistance between the source/drain was decreased and the decreased resistance was maintained even after the negative voltage was turned off. When positive voltage was applied, the resistance returned to a high value. From this, the device having a structure shown in FIG. 9 was found to operate as a memory device.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A doping method comprising
   attaching a metallocene or a fullerene derivative to a semiconductor surface directly or indirectly, and generating carriers in the vicinity of the semiconductor surface by charge transfer from the metallocene or the fullerene derivative to the semiconductor surface, wherein a thin dielectric film is formed on the semiconductor surface and wherein the metallocene or the fullerene derivative is attached via the thin dielectric film.

2. The doping method according to claim 1, wherein a dielectric film is deposited after attaching the metallocene or the fullerene derivative to the semiconductor surface or to the thin dielectric film.

3. The doping method according to claim 1, wherein the attached fullerene derivative is a fluorinated $C_{60}$ molecule.

4. The doping method according to claim 3, wherein the fluorinated fullerene is $C_{60}F_{36}$ or $C_{60}F_{48}$.

5. The doping method according to claim 1, wherein the semiconductor is made of silicon (Si).

6. A doping method comprising
   attaching a metallocene or a fullerene derivative to a semiconductor surface directly or indirectly, and generating carriers in the vicinity of the semiconductor surface by charge transfer from the metallocene or the fullerene derivative to the semiconductor surface, wherein a dielectric film is deposited after attaching the metallocene or the fullerene derivative to the semiconductor surface or to the thin film.

7. A doping method comprising
   attaching a metallocene or a fullerene derivative to a semiconductor surface directly or indirectly, and generating carriers in the vicinity of the semiconductor surface by charge transfer from the metallocene or the fullerene derivative to the semiconductor surface, wherein the attached metallocene is nickelocene.

8. The doping method according to claim 7, wherein the attached nickelocene is decamethylnickelocene.

9. A semiconductor device, wherein the device is produced by attaching a metallocene or a fullerene derivative to a semiconductor surface directly or indirectly and generating carriers in the vicinity of the semiconductor surface by charge transfer from the metallocene or the fullerene derivative to the semiconductor surface, wherein the device is produced by forming a thin dielectric film on the semiconductor surface and attaching the metallocene or the fullerene derivative to the surface of the dielectric film to generate carriers in the vicinity of the semiconductor surface by charge transfer from the metallocene or the fullerene derivative to the semiconductor surface.

10. The semiconductor device according to claim 9, wherein the semiconductor is made of silicon (Si).

11. The semiconductor device according to claim 9, wherein the device is produced by generating carriers via photo irradiation after attaching the metallocene or the fullerene derivative.

12. The semiconductor device according to claim 9, wherein a dielectric film is deposited and a gate electrode is formed thereon after attaching the metallocene or the fullerene derivative.

13. A semiconductor device, wherein the device is produced by attaching a metallocene or a fullerene derivative to a semiconductor surface directly or indirectly and generating carriers in the vicinity of the semiconductor surface by charge transfer from the metallocene or the fullerene derivative to the semiconductor surface, wherein the attached fullerene derivative is a fluorinated $C_{60}$ molecule.

14. The semiconductor device according to claim 13, wherein the fluorinated fullerene is $C_{60}F_{36}$ or $C_{60}F_{48}$.

15. A semiconductor device, wherein the device is produced by attaching a metallocene or a fullerene derivative to a semiconductor surface directly or indirectly and generating carriers in the vicinity of the semiconductor surface by charge transfer from the metallocene or the fullerene derivative to the semiconductor surface the semiconductor device according to claim 10, wherein the attached metallocene is nickelocene.

16. The semiconductor device according to claim 15, wherein the attached nickelocene is decamethylnickelocene.

17. A semiconductor device, wherein the device is produced by attaching a metallocene or a fullerene derivative to a semiconductor surface directly or indirectly and generating carriers in the vicinity of the semiconductor surface by charge transfer from the metallocene or the fullerene derivative to the semiconductor surface, wherein the device is produced by generating carriers via photo irradiation after attaching the metallocene or the fullerene derivative.

18. A semiconductor device, wherein the device is produced by attaching a metallocene or a fullerene derivative to a semiconductor surface directly or indirectly and generating carriers in the vicinity of the semiconductor surface by charge transfer from the metallocene or the fullerene derivative to the semiconductor surface, wherein a dielectric film is deposited and a gate electrode is further formed thereon after attaching the metallocene or the fullerene derivative.

* * * * *

UNITED STATES PATENT AND TRADEMARK OFFICE
CERTIFICATE OF CORRECTION

| | | |
|---|---|---|
| PATENT NO. | : 7,247,548 B2 | Page 1 of 1 |
| APPLICATION NO. | : 11/005285 | |
| DATED | : July 24, 2007 | |
| INVENTOR(S) | : Tada et al. | |

It is certified that error appears in the above-identified patent and that said Letters Patent is hereby corrected as shown below:

On the Title Page, replace the Assignee with:
(73)     Assignee:    NEC Corporation (JP)

Signed and Sealed this

Sixth Day of November, 2007

JON W. DUDAS
*Director of the United States Patent and Trademark Office*